United States Patent
Jeong et al.

(10) Patent No.: US 10,432,358 B2
(45) Date of Patent: *Oct. 1, 2019

(54) APPARATUS AND METHOD FOR TRANSMITTING AND RECEIVING DATA IN COMMUNICATION SYSTEM

(71) Applicant: Samsung Electronics Co., Ltd., Gyeonggi-do (KR)

(72) Inventors: Hong-Sil Jeong, Seoul (KR); Sung-Ryul Yun, Gyeonggi-do (KR); Hyun-Koo Yang, Seoul (KR); Se-Ho Myung, Gyeonggi-do (KR); Alain Mourad, Middlesex (GB); Ismael Gutierrez, Richmond (GB)

(73) Assignee: Samsung Electronics Co., Ltd (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/164,136

(22) Filed: Oct. 18, 2018

(65) Prior Publication Data

US 2019/0052404 A1 Feb. 14, 2019

Related U.S. Application Data

(63) Continuation of application No. 13/311,149, filed on Dec. 5, 2011, now Pat. No. 10,153,865.

(30) Foreign Application Priority Data

Dec. 3, 2010 (KR) .................. 10-2010-0123062
Dec. 2, 2011 (KR) .................. 10-2011-0128148

(51) Int. Cl.
*H04L 1/00* (2006.01)
*H03M 13/00* (2006.01)
(Continued)

(52) U.S. Cl.
CPC ....... *H04L 1/0068* (2013.01); *H03M 13/1165* (2013.01); *H03M 13/2906* (2013.01);
(Continued)

(58) Field of Classification Search
CPC ..... H04L 1/0068; H04L 1/0009; H04L 1/007; H04L 1/0057; H03M 13/1165;
(Continued)

(56) References Cited

U.S. PATENT DOCUMENTS 8,286,065 B2   10/2012 Myung et al.
2006/0123277 A1   6/2006 Hocevar
(Continued)

FOREIGN PATENT DOCUMENTS

EP   1 901 433   3/2008

OTHER PUBLICATIONS

Digital Video Broadcasting (DVB); Frame Structure Channel Coding and Modulation for a Second Generation Digital Terrestrial Television Broadcasting System (DVB-T2), ETSI EN 302 755 V1.2.1, European Standard (Telecommunications Series), Oct. 31, 2010, 177 pages.

(Continued)

*Primary Examiner* — Kyle Vallecillo
(74) *Attorney, Agent, or Firm* — The Farrell Law Firm, P.C.

(57) ABSTRACT

An apparatus and a method for transmitting and receiving a signal in a communication system are provided. The method includes checking a type of the signal to be transmitted; determining a number of puncture bits according to the type of the signal; and puncturing an encoded signal to be transmitted according to the number of puncture bits.

8 Claims, 15 Drawing Sheets

(51) Int. Cl.
  *H03M 13/29* (2006.01)
  *H03M 13/11* (2006.01)
  *H03M 13/35* (2006.01)
  *H03M 13/15* (2006.01)

(52) U.S. Cl.
  CPC ....... *H03M 13/353* (2013.01); *H03M 13/618* (2013.01); *H03M 13/6362* (2013.01); *H03M 13/6552* (2013.01); *H04L 1/007* (2013.01); *H04L 1/0009* (2013.01); *H03M 13/152* (2013.01); *H04L 1/0057* (2013.01)

(58) Field of Classification Search
  CPC ........... H03M 13/2906; H03M 13/353; H03M 13/618; H03M 13/6362; H03M 13/6552; H03M 13/152
  See application file for complete search history.

(56) References Cited

U.S. PATENT DOCUMENTS

| | | |
|---|---|---|
| 2006/0206781 A1 | 9/2006 | Choi et al. |
| 2007/0162814 A1* | 7/2007 | Shen ................. H03M 13/116 714/752 |
| 2008/0010582 A1 | 1/2008 | Nieto et al. |
| 2009/0037797 A1 | 2/2009 | Spencer et al. |
| 2009/0217129 A1* | 8/2009 | Myung .............. H03M 13/1102 714/752 |
| 2009/0217130 A1* | 8/2009 | Myung .............. H03M 13/1165 714/752 |
| 2009/0217141 A1 | 8/2009 | Eroz et al. |
| 2009/0222706 A1 | 9/2009 | Myung et al. |
| 2009/0259913 A1 | 10/2009 | Myung et al. |
| 2009/0259915 A1* | 10/2009 | Livshitz ............. H03M 13/1111 714/758 |
| 2010/0070828 A1 | 3/2010 | Murakami et al. |
| 2011/0307754 A1 | 12/2011 | Sun et al. |

OTHER PUBLICATIONS

S.L. Linfoot et al., "Flexible Modulation for Digital Terrestrial Broadcasting", Electronic Letters, Nov. 9, 2006, vol. 42, No. 23, 2 pages.
European Search Report dated Mar. 10, 2017 issued in counterpart application No. 11844049.4-1874, 7 pages.
Canadian Office Action dated Feb. 8, 2017 issued in counterpart application No. 2,818,126, 5 pages.
Korean Office Action dated Apr. 17, 2018 issued in counterpart application No. 10-2011-0128148, 9 pages.
European Search Report dated Jun. 26, 2018 issued in counterpart application No. 11844049.4-1220, 4 pages.
Jingbo Gao et al., "Rate-Compatible Punctured Low-Density Parity-Check Codes with Bit-Interleaved Coded Modulation", Proceedings of 2005 International.
Symposium on Intelligent Signal Processing and Communication Systems, Dec. 13-16, 2005.
Canadian Office Action dated Jun. 1, 2016 issued in counterpart application No. 2,818,126, 4 pages.
Korean Office Action dated Oct. 8, 2018 issued in counterpart application No. 10-2011-0128148, 5 pages.
Digital Video Broadcasting (DVB); Frame Structure Channel Coding and Modulation for a Second Generation Digital Terrestrial Television Broadcasting System (DVB-T2 ETSI EN 302 755 V1.3. 1, European Standard (Telecommunication Series), Nov. 2011.
Digital Video Broadcasting (DVB); Frame Structure Channel Coding and Modulation for a Second Generation Digital Terrestrial Television Broadcasting System (DVB-T2), ETSI EN 302 755 V1.1.1, European Standard (Telecommunications Series), (Published Sep. 2009; Public Enquiry: Oct. 2008).
Canadian Office Action dated Jan. 24, 2019 issued in counterpart application No. 3,001,602, 4 pages.
Korean Office Action dated Jan. 18, 2019 issued in counterpart application No. 10-2019-0002251, 4 pages.

* cited by examiner

■ LDPC Inf.LENGTH 3240 (ORIGINAL)
▲ LDPC Inf.LENGTH 2880
△ LDPC Inf.LENGTH 2520
□ LDPC Inf.LENGTH 2160
● LDPC Inf.LENGTH 1800
◇ LDPC Inf.LENGTH 1440
○ LDPC Inf.LENGTH 1080
★ LDPC Inf.LENGTH 720
◆ LDPC Inf.LENGTH 528
☆ LDPC Inf.LENGTH 360

FIG.3B

- ■ LDPC Inf.LENGTH 3240 (ORIGINAL)
- ▲ LDPC Inf.LENGTH 2880
- △ LDPC Inf.LENGTH 2520
- □ LDPC Inf.LENGTH 2160
- ● LDPC Inf.LENGTH 1800
- ◇ LDPC Inf.LENGTH 1440
- ○ LDPC Inf.LENGTH 1080
- ★ LDPC Inf.LENGTH 720
- ◆ LDPC Inf.LENGTH 528
- ☆ LDPC Inf.LENGTH 360

FIG.4B

APPARATUS AND METHOD FOR TRANSMITTING AND RECEIVING DATA IN COMMUNICATION SYSTEM

PRIORITY

The present application is a Continuation of U.S. application Ser. No. 13/311,149, which was filed in the U.S. Patent and Trademark Office on Dec. 5, 2011, and claims priority under 35 U.S.C. § 119(a) to Korean Patent Application Serial Nos. 10-2010-0123062 and 10-2011-0128148, which were filed in the Korean Intellectual Property Office on Dec. 3, 2010 and Dec. 2, 2011, respectively, the entire disclosure of each of which is incorporated herein by reference.

BACKGROUND OF THE INVENTION

1. Field of the Invention

The present invention relates generally to an apparatus and method for transmitting and receiving data in a broadcasting communication system and, more particularly, to an apparatus and a method for controlling a code rate according to data transmission and reception in a broadcasting communication system.

2. Description of the Related Art

Link performance of a broadcasting communication system may degrade due to noise, fading, and Inter-Symbol Interference (ISI). Thus, in order to realize high-speed digital broadcasting communication systems requiring high data throughput and high reliability, it is essential to develop techniques for overcoming the noise, fading, and ISI, In this regard, research has been conducted on error-correcting code for enhancing the communication reliability by efficiently reducing the information distortion. For example, error-correcting codes include Low Density Parity Check (LDPC) code.

Using the LDPC code, an encoder receives an information word including $K_{LDPC}$-ary bits or symbols and outputs $K_{parity}$-ary codeword bits or codeword symbols. When the information word bits ($K_{sig}$) which are input into the encoder are smaller than the information word bits $K_{LDPC}$, a transmitter shortens $K_{LDPC}-K_{sig}$ bits, and the encoder receives $K_{sig}$ bits. When parity bits ($N_{tx\_parity}$), which are required by the transmitter, are smaller than parity bits $N_{parity}$ output from the encoder, the transmitter punctures $N_{parity}-N_{tx\_parity}$ bits.

When the shortened bits increase, the code rate decreases. Thus, Bit Error Rate (BER)/Frame Error Rate (FER) performance of the code can get better than the non-shortened code. Meanwhile, when the punctured bits increase, the code rate increases and thus the BER/FER performance can get worse than the non-punctured code. Accordingly, a method for adaptively selecting the number of the shortened bits and the number of the punctured bits based on the length of the information word is required so that similar performance can be maintained irrespective of the information word length, in order to make the system more stable.

SUMMARY OF THE INVENTION

The present invention is designed to address at least the above-mentioned problems and/or disadvantages and to provide at least the advantages described below. Accordingly, an aspect of the present invention to provide an apparatus and a method for transmitting and receiving data in a broadcasting communication system.

Another aspect of the present invention is to provide an apparatus and a method for controlling a code rate in a broadcasting communication system.

Yet another aspect of the present invention is to provide an apparatus and a method for adaptively selecting a shortening/puncturing rate according to a length of an information word in a broadcasting communication system.

According to an aspect of the present invention, a method is provided for operating a transmit device. The method includes generating, by a hardware processor, parity bits by adding at least one shortened bit to bits comprising information bits to generate input bits for an encoding if a number of the information bits is less than a number of the input bits for the encoding, and applying the encoding to the input bits; identifying, by the hardware processor, a type of a signal to be transmitted to a receive device, the type of the signal corresponding to a protection level of the signal; determining, by the hardware processor, a first parameter and a second parameter based on the type of the signal; determining, by the hardware processor, a number of temporary puncture bits using the first parameter and the second parameter; determining, by the hardware processor, a number of puncture bits by adjusting the number of temporary puncture bits based on a modulation order of the signal; puncturing, by the hardware processor, at least one bit among the parity bits according to the number of the puncture bits; generating the signal based on remaining bits of the parity bits after the puncturing; and transmitting, by a transceiver, to the receive device, the signal. The first parameter is a ratio of a number of bits to be punctured to a number of bits to be shortened, and is multiplied by a number of the at least one shortened bit to generate a multiplication result, and the second parameter is an integer that is added to the multiplication result to determine the number of temporary puncture bits.

BRIEF DESCRIPTION OF THE DRAWINGS

The above and other aspects, features, and advantages of certain embodiments of the present invention will be more apparent from the following description taken in conjunction with the accompanying drawings, in which:

FIGS. 3A and 3B illustrate points of intersection according to an embodiment of the present invention;

FIGS. 4A and 4B illustrate points of intersection according to another embodiment of the present invention;

Throughout the drawings, like reference numerals will be understood to refer to like parts, components and structures.

DETAILED DESCRIPTION OF EMBODIMENTS OF THE PRESENT INVENTION

Figure 1:
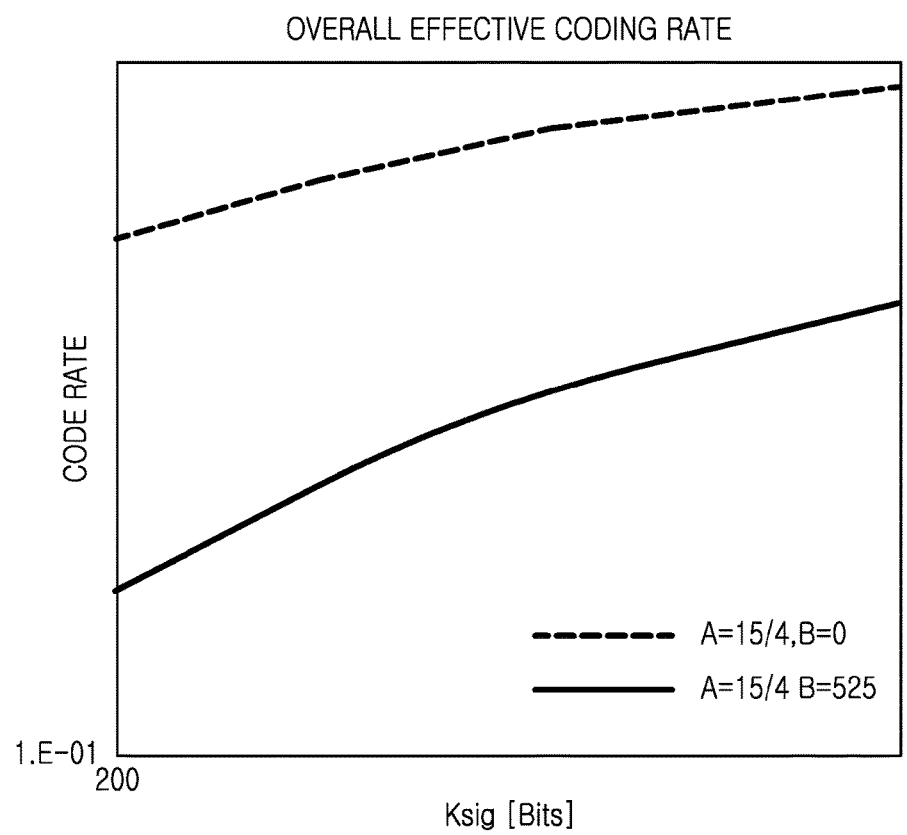
FIG. 1 illustrates code rate variation according to an embodiment of the present invention.

The following description with reference to the accompanying drawings is provided to assist in a comprehensive understanding of embodiments of the invention as defined by the claims and their equivalents. It includes various details to assist in that understanding but these should be regarded as examples. Accordingly, those of ordinary skill in the art will recognize that various changes and modifications of the embodiments described herein can be made without departing from the scope and spirit of the invention. Additionally, descriptions of well-known functions and constructions may be omitted for clarity and conciseness.

The terms and words used in the following description and claims are not limited to the dictionary meanings, but are merely used by the inventor(s) to enable a clear and consistent understanding of the invention. Accordingly, it should be apparent to those skilled in the art that the following description of embodiments of the present invention is provided for illustrative purposes only and not for the purpose of limiting the invention as defined by the appended claims and their equivalents.

It is to be understood that the singular forms "a," "an," and "the" include plural referents unless the context clearly dictates otherwise.

The term "substantially" means that the recited characteristic, parameter, or value need not be exact, but that deviations or variations, including for example, tolerances, measurement error, measurement accuracy limitations and other factors known to those of skill in the art, may occur in amounts that do not preclude the effect the characteristic was intended to provide.

Embodiments of the present invention provide a technique for controlling a code rate based on data transmission and reception in a communication system.

Hereinafter, descriptions are based on Digital Video Broadcasting (DVB)-the 2nd Generation Terrestrial (T2) system and DVB-Next Generation Handheld (NGH) system, which are European DVB standards. However, the code rate can also be controlled in other systems.

While it is assumed that the code rate is controlled according to transmission of signaling information, the code rate can also be controlled when other information is transmitted.

In a transmitter of a broadcasting communication system, the signaling information of an information word input to an encoder is of a variable length. The transmitter can shorten the information word input into the encoder or puncture the codeword output from the encoder. For example, when the information word including $K_{sig}$-ary bits is input to the encoder and $K_{LDPC}$-$K_{sig}$ bits are shortened, the number of the punctured bits for the shortened bits can be determined based on Equations (1), (2), (3) and (4), as shown below It is assumed that the encoder employs a concatenated coding scheme of a Bose, Chaudhuri, Hocquenghem (BCH) and Low Density Parity Check (LDPC) encoder.

When an LDPC code and a BCH code are concatenated and the information word length of the BCH code is $K_{bch}$, the number of the shortened bits is $K_{bch}$-$K_{sig}$ and, thus, the number of punctured bits can be determined based on Equation (1).

$$N_{punc} = \lfloor A \times (K_{bch} - K_{sig}) = B \rfloor \text{ where } 0 \leq B \quad (1)$$

In Equation (1), $N_{punc}$ denotes the number of the punctured bits, A denotes a ratio of the punctured bits to the shortened bits, $K_{bch}$ denotes the information word length of the BCH code, $K_{sig}$ denotes the number of bits of the information word input to the encoder after shortening, and B denotes a correction factor.

Meanwhile, when the LDPC code and the BCH code are not concatenated, the number of the shortened bits is $K_{LDPC}$-$K_{sig}$ and accordingly the number of the punctured bits can be determined based on Equation (2).

$$N_{punc} = \lfloor A \times (K_{LDPC} - K_{sig}) - B \rfloor \text{ where } 0 \leq B \quad (2)$$

In Equation (2), $N_{punc}$ denotes the number of punctured bits, A denotes the ratio of punctured bits to the shortened bits, $K_{LDPC}$ denotes the information word length of the LDPC code, $K_{sig}$ denotes the number of bits of the information word input to the encoder after shortening, and B denotes the correction factor.

When the number of the punctured bits is determined based on Equation (1) or Equation (2), the transmitter can encode data at a lower code rate than the code rate of non-shortening and puncturing.

For example, when the LDPC code and the BCH code are concatenated, the number of shortened bits is $K_{bch}$-$K_{sig}$ and accordingly the number of punctured bits can be determined based on Equation (3).

$$N_{punc} = \lfloor A \times (K_{bch} - K_{sig}) + B \rfloor \text{ where } 0 \leq B < N_{parity} - A(K_{bch} - K_{sig\_min}) \quad (3)$$

In Equation (3), $N_{punc}$ denotes the number of punctured bits, A denotes the ratio of punctured bits to shortened bits, $K_{bch}$ denotes the information word length of the BCH code, $K_{sig}$ denotes the number of bits of the information word input to the encoder after shortening, B denotes the correction factor, and $K_{sig\_min}$ denotes the number of bits of the smallest information word among the information words input to the encoder after shortening.

When the LDPC code and the BCH code are not concatenated, the number of the shortened bits is $K_{LDPC}$-$K_{sig}$ and, accordingly, the number of the punctured bits can be determined based on Equation (4).

$$N_{punc} = \lfloor A \times (K_{LDPC} - K_{sig}) + B \rfloor \text{ where } 0 \leq B < N_{parity} - A(K_{LDPC} - K_{sig\_min}) \quad (4)$$

In Equation (4), $N_{punc}$ denotes the number of punctured bits, A denotes the ratio of punctured bits to the shortened bits, $K_{LDPC}$ denotes the information word length of the LDPC code, $K_{sig}$ denotes the number of bits of the information word input to the encoder after shortening, B denotes the correction factor, and $K_{sig\_min}$ denotes the number of bits of the smallest information word among the information words input to the encoder after shortening.

The punctured bits $N_{punc}$ fall below the parity bits $N_{parity}$ only when the condition of $B < N_{parity} - A(K_{LDPC} - K_{sig\_min})$ in Equations (3) and (4) is satisfied.

In Equations (1), (2), (3) and (4), the number of the punctured bits can be adjusted according to A and B. That is, A and B vary the code rate as shown in FIGS. 1 and 2.

Figure 2:
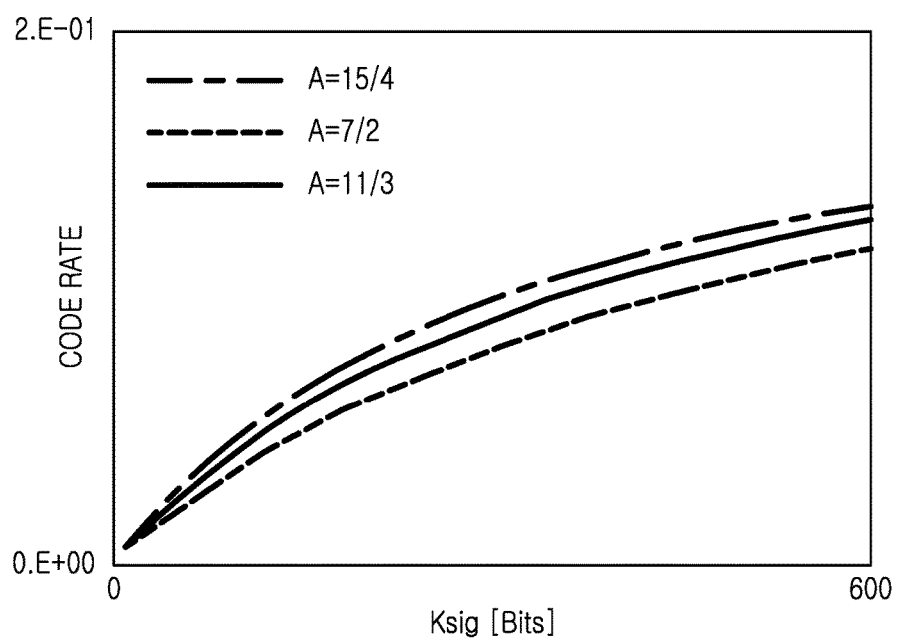
FIG. 2 illustrates code rate variation according to another embodiment of the present invention.

FIG. 1 illustrates the code rate variation according to one embodiment of the present invention.

In FIG. 1, the code rate changes when A=15/4 and B=525 are applied to Equation (1) and when A=15/4 and B=0 are applied to Equation (1) with $K_{bch}$=754, $K_{LDPC}$=864, and $N_{LDPC}$=4320.

As shown in FIG. 1, the code rate for transmitting the information varies according to the change of B in Equation (1).

FIG. 2 illustrates the code rate variation according to another embodiment of the present invention.

In FIG. 2, the code rate changes when A=15/4 and B=0 are applied to Equation (1), when A=7/2 and B=0 are applied to Equation (1), and A=11/3 and B=0 are applied to Equation (1) with $K_{bch}$=3072, $K_{LDPC}$=3240, and $N_{LDPC}$=16200.

As shown in FIG. 2, the code rate for transmitting the information varies according to the change of A in Equation (1). The greater A is, the higher the code rate.

As stated above, the code rate of the actual transmission and the performance of the transmitted code vary according to A and B. Particularly, there are multiple point of intersections where there is no difference in Bit Error Rate (BER)/Frame Error Rate (FER) performance according to A and B. For example, when A is greater, a relatively high code rate is used for the short-length input bits and the point of intersection occurs at a higher area, as shown in FIG. 3.

Figure 3A:
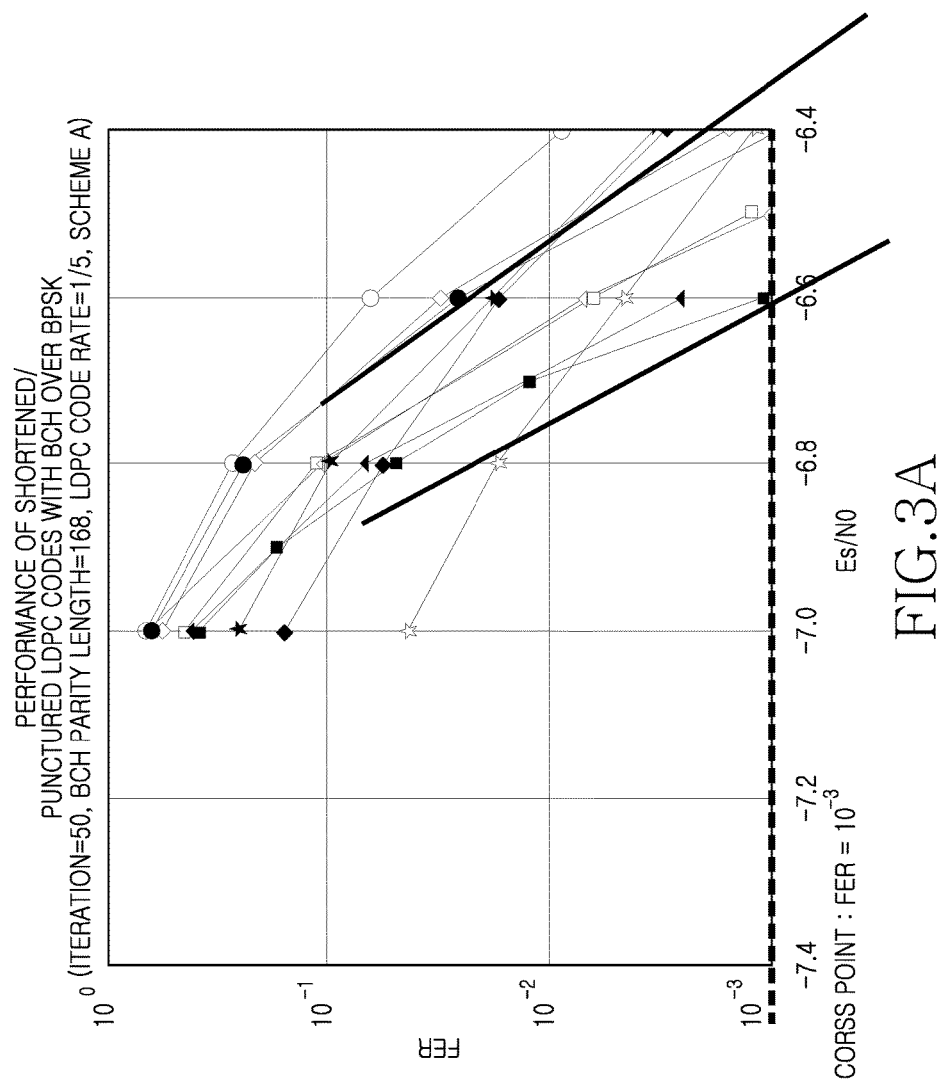

FIGS. 3A and 3B illustrate the points of intersection, according to one embodiment of the present invention.

When A is 15/4 in FIG. 2, the code rate is higher than A of 11/3 and the point of intersection generates at FER=$10^{-3}$ as shown in FIG. 3.

Figure 4A:
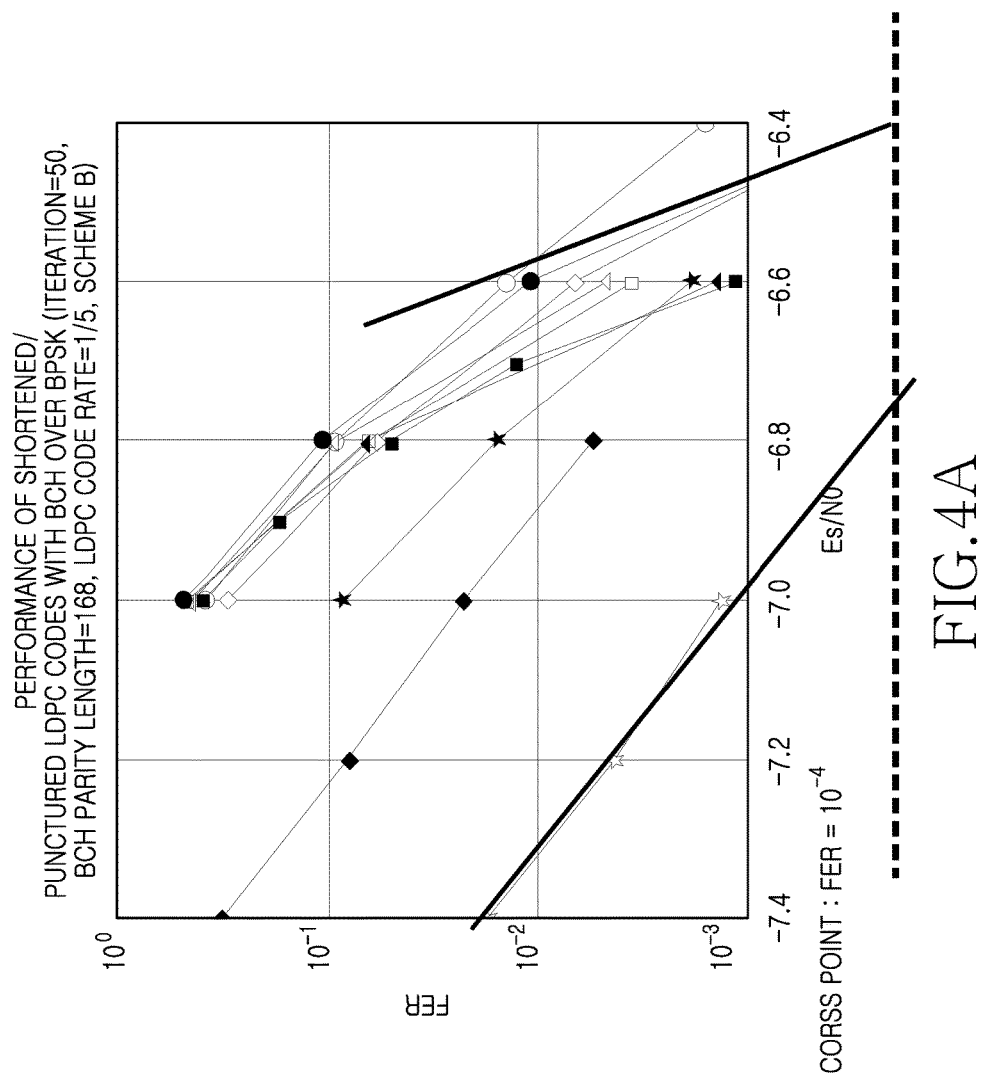

For example, when A is small, the code rate is relative low for the short input bits and the point of intersection generates in a low area as shown in FIG. 4A.

FIGS. 4A and 4B depict points of intersection according to another embodiment of the present invention.

When A is 11/3 in FIG. 2, the code rate is lower than A of 15/4 and the point of intersection generates at FER=$10^{-4}$ as shown in FIG. 4.

As such, the code rate varies according to the number of puncture bits determined by A and B, and the point of intersection of the BER/FER differs based on the variation of the code rate.

Figure 5:
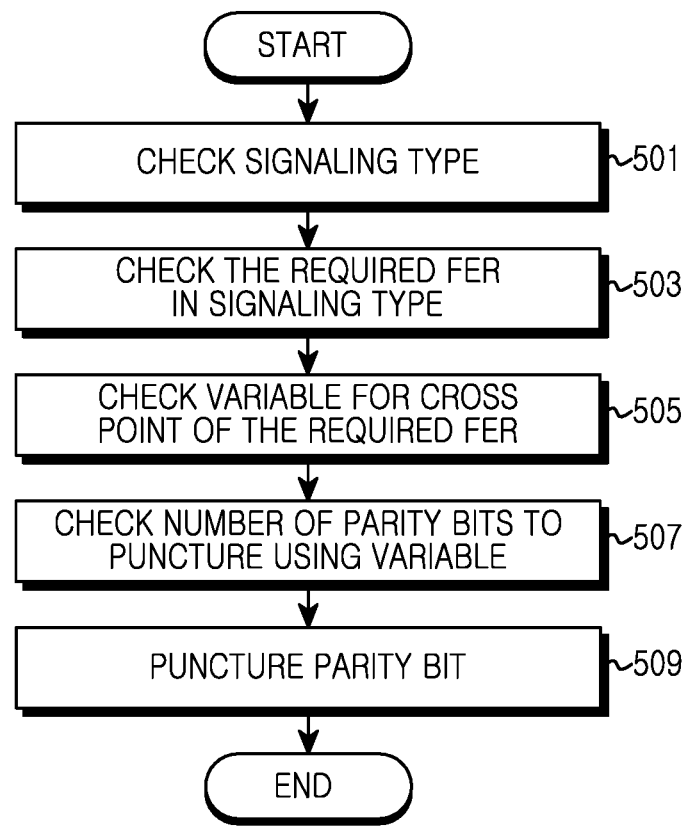
FIG. 5 illustrates a method for puncturing a parity bit based on a signaling type according to an embodiment of the present invention.

The transmitter can adaptively select A and B to satisfy the requirement of the signaling as shown in FIG. 5. That is, the transmitter can adaptively select A and B based on the performance required by the system when the parity bits of the signaling are decoded.

FIG. 5 illustrates a method for puncturing the parity bit based on a signaling type according to an embodiment of the present invention.

In step 501, the transmitter checks the signaling type for the transmission. For example, referring to the Digital Video Broadcasting (DVB) standard such as the DVB-T2 standard (ETSI EN 302 755), physical (L1) signaling information is delivered through L1-pre, L1-config and L1-dyn. In the DVB-T2 standard, the L1-pre signaling includes basic information to decode, L1-config signaling includes parameters that remain the same for some duration, and L1-dyn signaling includes parameters that are changeable frequently. The transmitter determines which of L1-pre, L1-config, and L1-dyn is the type of the signaling to transmit.

In step 503, the transmitter checks the required FER based on the signaling type. For example, when the signaling type is L1-pre, the transmitter checks the performance required by the receiver to decode the signal of L1-pre received from the transmitter.

In step 505, the transmitter selects a variable for satisfying the point of intersection of the required FER confirmed in step 503. Herein, the variable includes A and B used to determine the number of puncture bits in Equation (1), (2), (3) and (4).

In step 507, the transmitter checks the number of bits to puncture using the selected variable. For example, the transmitter determines the number of bits to puncture by applying the selected A and B to Equation (1) or (2).

In step 509, the transmitter punctures the parity bit according to the number of bits confirmed in step 507. Next, the transmitter finishes this process.

Figure 6:
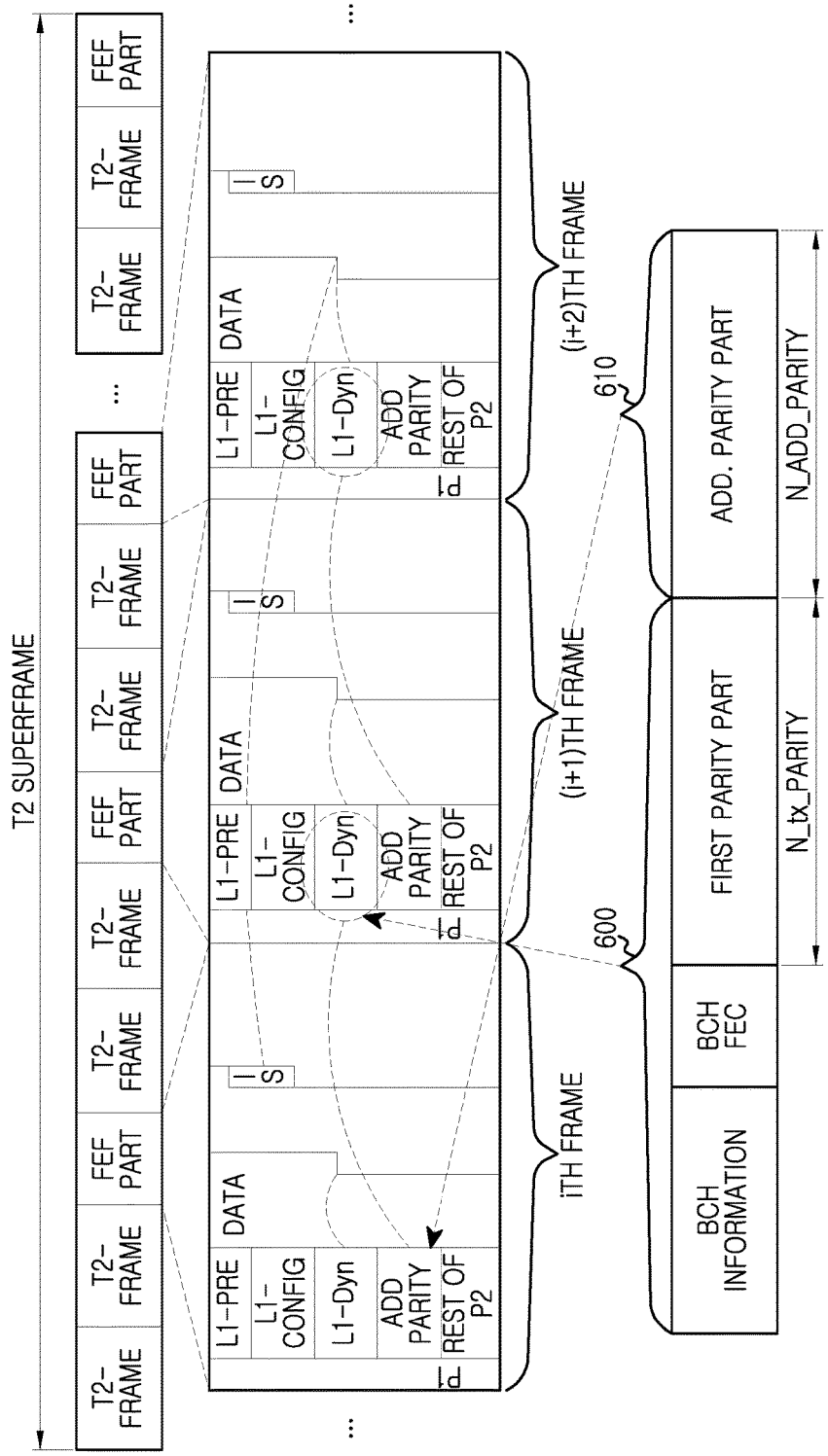
FIG. 6 illustrates a frame for carrying parity bits of two types according to an embodiment of the present invention.

FIG. 6 illustrates a frame for carrying the parity bits of two types, according to an embodiment of the present invention.

When the transmitter sends the information in the (i+1)-th frame as shown in FIG. 6, the transmitter sends the first parity bits in the (i+1)-th frame together with the information word, and sends the second parity bits 610 in the i-th frame.

The receiver decodes the information word and the first parity bits received in the (i+1)-th frame. When failing to decode the information word and the first parity bits received in the (i+1)-th frame, the receiver decodes them using the second parity bits received in the i-th frame as well. For example, when failing to decode the information word and the first parity bits received in the (i+1)-th frame, the receiver recognizes the signaling decoding failure. Hence, the receiver stores the second parity bits of the (i+1)-th frame and then receives the (i+2)-th frame.

As such, when the receiver decodes the information word, the FER performance required to decode the information word and the first parity bits can differ from the FER performance required to decode the information word and the first parity together with the second parity. Thus, the transmitter can use different A and B of the first parity bits and the second parity bits as shown in FIG. 7.

Figure 7:
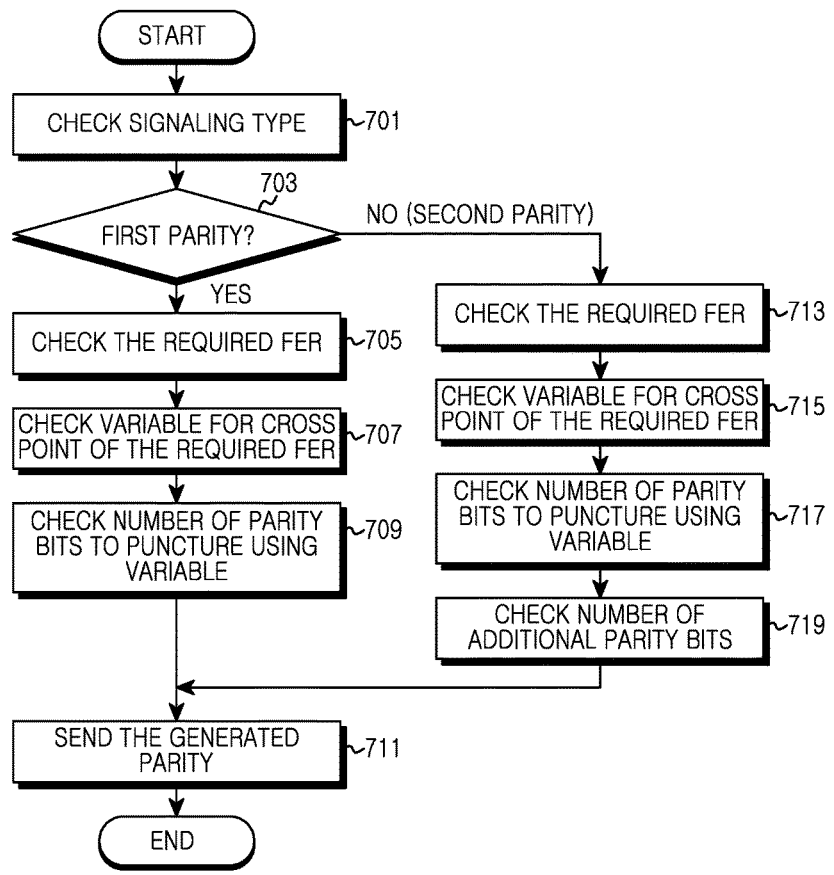
FIG. 7 illustrates a puncturing method according to a parity bit type according to an embodiment of the present invention.

FIG. 7 illustrates a puncturing method according to the parity bit type according to an embodiment of the present invention.

In step 701, the transmitter checks the signaling type for the transmission. For example, the transmitter checks the first parity bits of the corresponding information word and the second parity bits, as shown in FIG. 6.

In step 703, the transmitter determines whether the checked signaling is the first parity bits.

When the signaling is the first parity bits, the transmitter checks the required FER of the first parity bits in step 705. For example, the transmitter checks the required FER performance when the receiver decodes the information word and the first parity received from the transmitter.

In step 707, the transmitter selects the variable for satisfying the point of intersection of the required FER confirmed in step 705. The variable includes A and B used to determine the number of bits to puncture in Equation (1) and (2).

Figure 8:
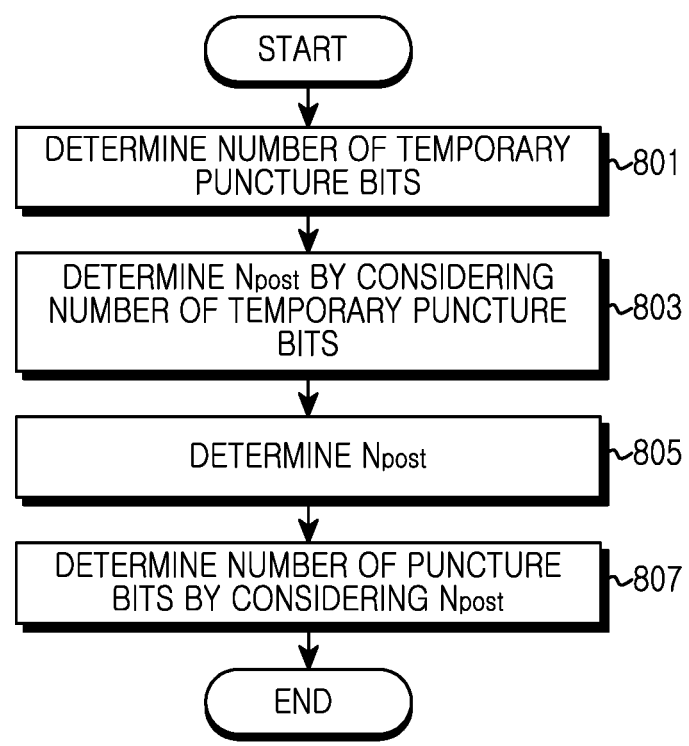
FIG. 8 illustrates a method for determining the number of puncture bits according to one embodiment of the present invention.

In step 709, the transmitter checks the number of bits to puncture using the selected variable. For example, the transmitter determines the bits to puncture as shown in FIG. 8.

In step 711, the transmitter sends the parity bits. When there are the bits to puncture in step 709, the transmitter punctures and transmits the parity based on the bits to puncture checked in step 709.

When the signaling is the second parity bits in step 703, the transmitter checks the required FER of the second parity bits in step 713. For example, the transmitter checks the required FER performance when the receiver decodes the information word and the first parity bits together with the second parity bits received from the transmitter.

In step 715, the transmitter selects the variable for satisfying the point of intersection of the required FER. Herein, the variable includes A and B used to determine the number of bits to puncture in Equation (1), (2), (3) and (4).

Figure 9:
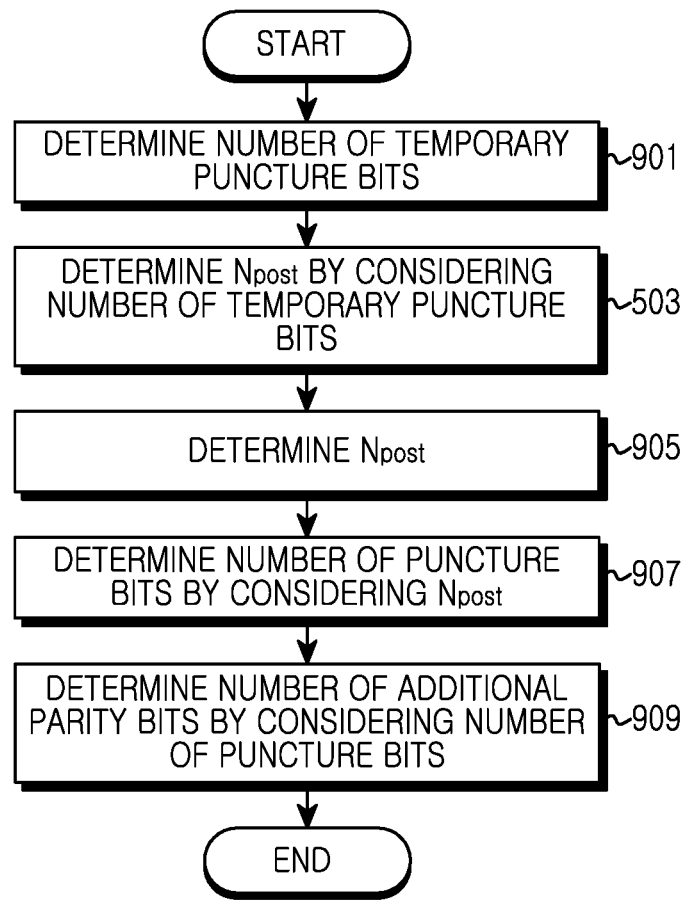
FIG. 9 illustrates a method for determining the number of puncture bits according to another embodiment of the present invention.

In step 717, the transmitter checks the number of bits to puncture using the selected variable. For example, the transmitter determines the bits to puncture as shown in FIG. 9.

In step 719, the transmitter checks the number of the additional parity bits. For example, the transmitter determines the length of the second parity bits added to the previous frame of the frame including the information word as shown in FIG. 9.

In step 711, the transmitter sends the parity bits. When there are the bits to puncture in step 717, the transmitter punctures and transmits the parity bits based on the bits to puncture checked in step 717. Next, the transmitter finishes this process.

FIG. 8 illustrates a method for determining the number of puncture bits according to one embodiment of the present invention.

Upon checking the number of bits to puncture in the first parity bits, the transmitter determines the number of temporary puncture bits in step 801. For example, the transmitter determines the temporary puncture bits $N_{punc\_temp}$ by applying A and B checked in step 707 of FIG. 7 to Equation (1).

Figure 13:
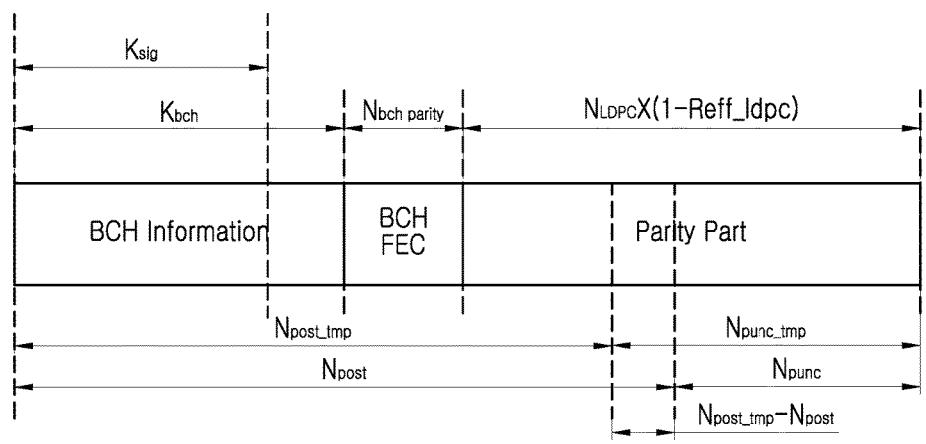
FIG. 13 illustrates a codeword according to an embodiment of the present invention.

In step 803, the transmitter determines a temporary $N_{post}$ ($N_{post\_temp}$) using the temporary puncture bits. For example, the transmitter determines the temporary $N_{post}$ ($N_{post\_temp}$) based on Equation (5) as shown in FIG. 13. The temporary $N_{post}$ denotes the number of bits temporarily determined for the actual transmission.

$$N_{post\_temp}=K_{sig}+N_{bch\_parity}+N_{LDPC}\times(1-R_{eff\_LDPC})-N_{punc\_temp} \quad (5)$$

In Equation (5), $N_{post\_temp}$ denotes the temporary $N_{post}$, $K_{sig}$ denotes the number of bits of the information word input to the encoder, $N_{bch\_parity}$ denotes the parity bit of the BCH code when the BCH code is used, $N_{LDPC}$ denotes the number of codeword bits of the LDPC code, $R_{eff\_LDPC}$ denotes the code rate without the puncture and the shortening, and $N_{punc\_temp}$ denotes the number of temporary puncture bits. That is, $N_{LDPC}\times(1-R_{eff\_LDPC})-N_{punc\_temp}$ represents the number of parity bits prior to the puncturing. When the BCH code is not used, the transmitter sets $N_{bch\_parity}$ of Equation (5) to zero.

In step 805, the transmitter determines $N_{post}$ using the temporary $N_{post}$. The transmitter needs to correct the temporary $N_{post}$ in the case in which the number of the transmitted bits is limited. For example, according to 16 Quadrature Amplitude Modulation (16-QAM), the number of the transmitted bits should be twice the number of bits $\eta_{MOD}$ of a modulation signal. Accordingly, the transmitter determines the bits $N_{post}$ actually transmitted based on Equation (6) as shown in FIG. 13.

$$N_{post} = \begin{cases} \left[\frac{N_{post\_temp}}{2\eta_{MOD}}\right] \times 2\eta_{MOD}, & \eta_{MOD} = 4 \\ \left[\frac{N_{post\_temp}}{\eta_{MOD}}\right] \times \eta_{MOD}, & \text{otherwise} \end{cases} \quad (6)$$

In Equation (6), $N_{post}$ denotes the number of bits actually transmitted bits, $\eta_{MOD}$ denotes a modulation order, and $N_{post\_temp}$ denotes the temporary $N_{post}$. The modulation order includes 1, 2, 4 and 6 for representing Binary Phase Shift Keying (BPSK), Quadrature Phase Shift Keying (QPSK), 16-QAM, and 64-QAM.

In step 807, the transmitter determines the number of bits to puncture in the first parity bits using the temporary puncture bits, $N_{post}$, and the temporary $N_{post}$. For example, the transmitter determines the number of bits to puncture in the first parity bits based on Equation (7).

$$N_{punc}=N_{punc\_temp}-(N_{post}-N_{post\_temp}) \quad (7)$$

In Equation (7), $N_{punc}$ denotes the number of bits to puncture in the first parity bits, $N_{punc\_temp}$ denotes the number of temporary puncture bits, $N_{post}$ denotes the bits actually transmitted, and $N_{post\_temp}$ denotes the temporary $N_{post}$. Next, the transmitter finishes this process.

FIG. 9 illustrates a method for determining the number of puncture bits according to another embodiment of the present invention.

Upon confirming the number of bits to puncture in the second parity bits, the transmitter determines the number of temporary puncture bits in step 901. For example, the transmitter determines the number of temporary puncture bits $N_{punc\_temp}$ by applying A and B confirmed in step 715 of FIG. 7 to Equation (1).

In step 903, the transmitter determines the temporary $N_{post}$ ($N_{post\_temp}$) using the number of temporary puncture bits. For example, the transmitter determines the temporary) $N_{post}$ ($N_{post\_temp}$) based on Equation (8).

$$N_{post\_temp}=N_{punc}-N_{punc\_temp\_add} \quad (8)$$

In Equation (8), $N_{post\_temp}$ denotes the temporary $N_{post}$, $N_{punc}$ denotes the number of puncture bits of the first parity bits, and $N_{post\_temp\_add}$ denotes the number of temporary puncture bits of the second parity bits.

In step 905, the transmitter determines $N_{post}$ using the temporary $N_{post}$. Herein, the transmitter determines $N_{post}$ based on Equation (6). In step 907, the transmitter determines the number of bits to puncture in the second parity bits using the number of temporary puncture bits, $N_{post}$, and the temporary $N_{post}$. For example, the transmitter determines the number of bits to puncture in the second parity bits based on Equation (7).

In step 909, the transmitter determines the number of bits of the second parity bits. For example, the transmitter determines the number of bits of the second parity bits based on Equation (9).

$$N_{add\_parity}=N_{punc}-N_{punc\_add\_parity} \quad (9)$$

In Equation (9), $N_{add\_parity}$ denotes the number of bits of the second parity bits, $N_{punc}$ denotes the number of puncture bits of the first parity bits, and $N_{punc\_add\_parity}$ denotes the number of temporary puncture bits of the second parity bits. Next, the transmitter finishes this process.

A method of receiving a signal from a transmitter in which the signal is shortened and punctured will now be described.

Figure 10:
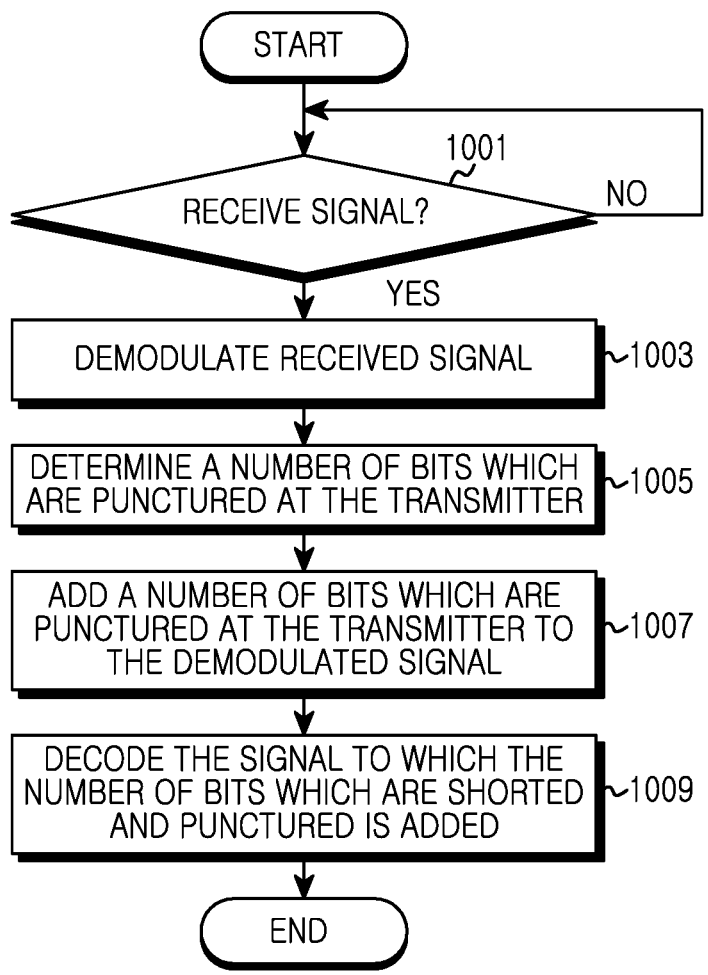
FIG. 10 illustrates a flowchart for receiving a signal according to an embodiment of the present invention.

FIG. 10 illustrates a flowchart for receiving a signal at a receiver according to an embodiment of the present invention. The signal is the signaling information that is shortened and punctured by the transmitter.

Referring FIG. 10, in step 1001, the receiver receives the signal transmitted from the transmitter.

Next, in step 1003, the receiver demodulates the signal considering the modulation scheme of the transmitter. For example, the receiver determines the probability that each bit of the received signal is a 1 at the transmitter (probability 1) and probability that each bit of the received signal is a 0 at the transmitter (probability 2). Thereafter, the receiver determines a Log Likelihood Ratio (LLR), which is a ratio between probability 1 and probability 2.

Next, in step 1005, the received determines the number of bits in the signal which is punctured at the transmitter prior to transmission. For example, the receiver may determine the number of bits that are punctured at the transmitter according to the signaling type as shown in FIG. 5. In another example, the receiver may determine the number of bits that are punctured at the transmitter according to the signaling type and the parity type as shown in FIG. 7.

After determining the number of bits that are punctured at the transmitter, the receiver, in step 1007, adds the number of bits that are punctured at the transmitter to the demodulated signal. The number of shortened bits may also be added. For example, the receiver adds "0" which is the number of bits that are shortened and punctured at the transmitter to the signal demodulated in step 1003.

In step 1009, the receiver decodes the signal to which the number of bits that are shortened and punctured is added. And by decoding, the receiver determines the information word in the received signal from the transmitter.

As stated above, the receiver determines the number bits that are punctured at the transmitter after demodulation of the received signal.

Moreover, the receiver may determine the number bits that are punctured at the transmitter and then may demodulate the received signal. A structure of the transmitter for adjusting the shortening/puncturing ratio according to the required performance of the system will now be explained.

Figure 11:
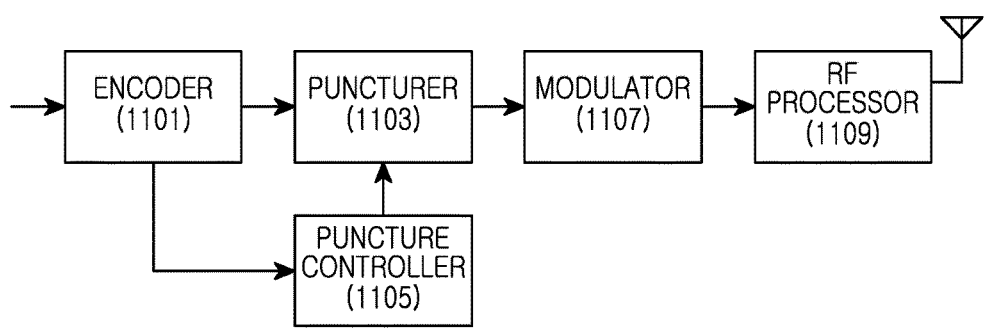
FIG. 11 illustrates a transmitter according to an embodiment of the present invention.

FIG. 11 illustrates the transmitter structure according to an embodiment of the present invention.

As shown in FIG. 11, the transmitter includes an encoder 1101, a puncturer 1103, a puncture controller 1105, a modulator 1107, and a Radio Frequency (RF) processor 1109.

The encoder 1101 outputs the coded bits generated by encoding the information bits to transmit. For example, when the encoder 1101 is the BCH/LDPC encoder, the encoder 1101 BCH-encodes the $K_{bch}$-ary information bits and, thus, generates the BCH codeword including the $K_{LDPC}$-ary bits. The encoder 1001 then generates and outputs the LDPC codeword including the $N_{LDPC}$-ary bits by LDPC-encoding the BCH codeword.

The puncturer 1103 punctures the codeword output from the encoder 1101 according to a puncture pattern and the number of puncture bits provided from the puncture controller 1105.

The puncture controller 1105 determines the number of puncture bits according to the required performance of the system. For example, the puncture controller 1105 determines A and B in order to satisfy the required performance of the system based on the type of signaling to transmit from the transmitter as shown in FIG. 5. The puncture controller 1105 then determines the number of puncture bits by applying A and B to Equation (1), (2), (3), and (4). For example, the puncture controller 1105 may determine the number of puncture bits according to the parity type as shown in FIG. 7.

The modulator 1107 modulates and outputs the signal fed from the puncturer 1103 according to the corresponding modulation scheme.

The RF processor 1109 converts the modulated signal output from the modulator 1107 to an RF signal and sends the RF signal over an antenna.

As set forth above, the shortening/puncturing ratio is selected adaptively according to the channel state condition required in the communication system. Thus, the system stability is sustained irrespective of the length of the information word.

Additionally, the diversity gain for the signaling information can be achieved by selectively determining the amount of parity bits transmitted over the different frame in the communication system.

A receiver for receiving a signal from a transmitter in which the signal is shortened and punctured will now be described.

Figure 12:
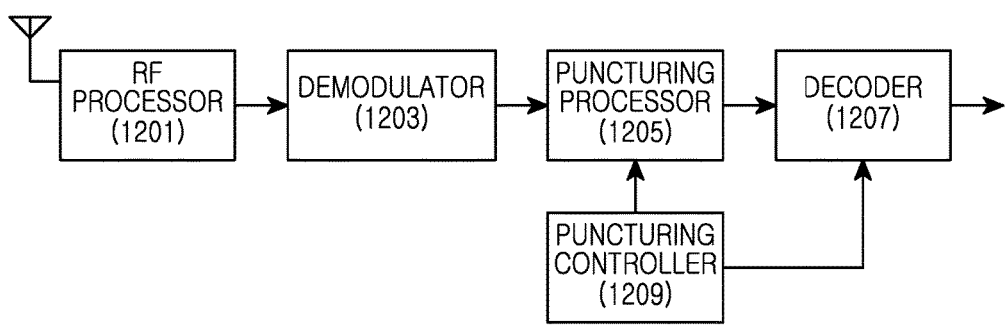
FIG. 12 illustrates a receiver according to an embodiment of the present invention.

FIG. 12 illustrates a receiver according to an embodiment of the present invention.

Referring to FIG. 12, the receiver may include an RF processor (1201), a demodulator (1203), a puncturing processor (1205), a decoder (1207) and a puncturing controller (1209).

The RF processor (1201) converts a high frequency signal received via an antenna (not shown) to a base band signal and provides the base band signal to the demodulator (1203).

The demodulator (1203) demodulates the signal from the RF processor (1201) according to the corresponding modulation scheme. For example, the demodulator determines the probability that each bit of the received signal is a 1 at the modulator (1107) of the transmitter (probability 3) and probability that each bit of the received signal is a 0 at the modulator (1107) of the transmitter (probability 4). The demodulator then determines the LLR, which is a ratio between the probability 3 and the probability 4.

The puncturing processor (1205) adds the number of bits that are punctured provided from the puncturing controller (1209) to the demodulated signal from the demodulator (1203). The number of shortened bits may also be added. For example, the puncturing processor (1205) adds "0" which is the number of bits that are shortened and punctured to the signal demodulated by the demodulator (1203).

The puncturing controller (1209) determines the number of bits in the received signal that are punctured at the transmitter. For example, the puncturing controller (1209) may be an A value and a B value which are satisfactory for the performance of a communication system according to the signaling type as shown in FIG. 5. The puncturing controller (1209) may then determine the number of bits that are punctured at the transmitter in the received signal according to the above Equation 1, Equation 2, Equation 3 or Equation 4. In another example, the puncturing controller (1209) may determine the number of bits that are punctured at the transmitter according to the parity type (and the signaling type) as shown in FIG. 7. Further, the puncturing controller (1209) may determine the number of bits that are punctured at the transmitter based on a received control signal from a controller at the transmitter.

The decoder (1207) decodes a signal from the puncturing processor (1205) and outputs an information word bit. For example, if BCH/LDPC code is used, the decoder (1207) decodes received LLR values in the number of $N_{LDPC}$ and restores bits in the number of $N_{LDPC}$ and outputs information words in the number of $K_{BCH}$ via BCH decoding.

FIG. 13 illustrates a codeword according to an embodiment of the present invention. The codeword is configured as shown and as stated above, for example, the transmitter determines the temporary $N_{post}$ ($N_{post\_temp}$) based on Equation (5). The temporary $N_{post}$ denotes the number of bits temporarily determined for the actual transmission. In another example, according to 16 Quadrature Amplitude Modulation (16-QAM), the number of the transmitted bits should be twice the number of bits $\eta_{MOD}$ of a modulation signal. Accordingly, the transmitter determines the bits $N_{post}$ actually transmitted based on above Equation (6).

While the invention has been shown and described with reference to certain embodiments thereof, it will be understood by those skilled in the art that various changes in form and details may be made therein without departing from the spirit and scope of the invention as defined by the appended claims and their equivalents.

What is claimed is:

1. A method for operating a transmit device, the method comprising:
    generating, by a hardware processor, parity bits by adding at least one shortened bit to bits comprising information bits to generate input bits for an encoding if a number of the information bits is less than a number of the input bits for the encoding, and applying the encoding to the input bits;
    identifying, by the hardware processor, a type of a signal to be transmitted to a receive device, the type of the signal corresponding to a protection level of the signal;
    determining, by the hardware processor, a first parameter and a second parameter based on the type of the signal;
    determining, by the hardware processor, a number of temporary puncture bits using the first parameter and the second parameter;
    determining, by the hardware processor, a number of puncture bits by adjusting the number of temporary puncture bits based on a modulation order of the signal;
    puncturing, by the hardware processor, at least one bit among the parity bits according to the number of the puncture bits;
    generating the signal based on remaining bits of the parity bits after the puncturing, and
    transmitting, by a transceiver, to the receive device, the signal,
    wherein the first parameter is a ratio of a number of bits to be punctured to a number of bits to be shortened, and is multiplied by a number of the at least one shortened bit to generate a multiplication result, and
    wherein the second parameter is an integer that is added to the multiplication result to determine the number of temporary puncture bits.

2. The method of claim 1, wherein the type of the signal indicates whether the signal is generated based on additional parity bits, and
    wherein a number of the additional parity bits is determined based on the number of puncture bits for the parity bits.

3. The method of claim 1, wherein the type of the signal comprises at least one of L1-pre, L1-config, L1-dyn, and a transmission location of parity bits of a transmitted information word.

4. The method of claim 1, wherein the determining of the number of puncture bits comprises:
    determining the number of puncture bits based on:
    $$N_{punc} = \lfloor A \times (K_{bch} - K_{sig}) - B \rfloor \text{ where } 0 \le B$$
    wherein $N_{punc}$ denotes the number of the punctured bits, A denotes the first parameter, $K_{bch}$ denotes an information word length of a Bose, Chaudhuri, Hocquenghem (BCH) code, $K_{sig}$ denotes a number of bits of an information word input to an encoder, and B denotes the second parameter.

5. The method of claim 1, wherein the determining of the number of puncture bits comprises:
    determining the number of puncture bits based on:
    $$N_{punc} = \lfloor A \times (K_{bch} - K_{sig}) + B \rfloor \text{ where } 0 \le B < N_{parity} - A(K_{bch} - K_{sig\_min})$$
    where $N_{punc}$ denotes the number of the punctured bits, A denotes the first parameter, $K_{bch}$ denotes an information word length of a Bose, Chaudhuri, Hocquenghem (BCH) code, $K_{sig}$ denotes a number of bits of an information word input to an encoder, B denotes the second parameter, and $K_{sig\_min}$ denotes the number of bits of the smallest information word among information words input to the encoder.

6. The method of claim 1, wherein the signal is encoded using a Bose, Chaudhuri, Hocquenghem (BCH)/low density parity check (LDPC) encoder.

7. The method of claim 1, wherein the first parameter and the second parameter satisfy a value of intersection point of a frame error rate (FER) performance required by a communication system,
    wherein the intersection point is a point which satisfies no performance difference between a bit error rate (BER) performance and the FER performance.

8. The method of claim 1, wherein the number of puncture bits is determined based on:
    $$N_{punc} = \lfloor A \times (K_{LDPC} - K_{sig}) + B \rfloor$$
    wherein $N_{punc}$ denotes the number of the puncture bits, A denotes the first parameter, $K_{LDPC}$ denotes an information word length of a low density parity check (LDPC) code, $K_{sig}$ denotes a number of bits of an information word after a shortening of at least one bit for the LDPC code, and B denotes the second parameter.

* * * * *